(12) United States Patent
Ikegawa et al.

(10) Patent No.: US 10,519,550 B2
(45) Date of Patent: Dec. 31, 2019

(54) FILM FORMATION APPARATUS

(71) Applicant: TOKYO ELECTRON LIMITED, Tokyo (JP)

(72) Inventors: Hiroaki Ikegawa, Nirasaki (JP); Hiroyuki Wada, Nirasaki (JP); Katsuyuki Hishiya, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 361 days.

(21) Appl. No.: 15/387,043

(22) Filed: Dec. 21, 2016

(65) Prior Publication Data

US 2017/0183779 A1 Jun. 29, 2017

(30) Foreign Application Priority Data

Dec. 24, 2015 (JP) .................................. 2015-252081

(51) Int. Cl.
*C23C 16/50* (2006.01)
*C23C 16/511* (2006.01)
*C23C 16/44* (2006.01)
*C23C 16/455* (2006.01)
*C23C 16/458* (2006.01)
(Continued)

(52) U.S. Cl.
CPC ........ *C23C 16/511* (2013.01); *C23C 16/4412* (2013.01); *C23C 16/4584* (2013.01); *C23C 16/45544* (2013.01); *C23C 16/45551* (2013.01); *C23C 16/45578* (2013.01); *H01L 21/0217* (2013.01); *H01L 21/0228* (2013.01); *H01L 21/02211* (2013.01); *H01L 21/02274* (2013.01);
(Continued)

(58) Field of Classification Search
CPC .............. C23C 16/50; C23C 16/45542; C23C 16/45548; H01L 21/0217; H01L 21/02274
See application file for complete search history.

(56) References Cited

U.S. PATENT DOCUMENTS 10,145,014 B2 * 12/2018 Nozawa ............ H01J 37/32192
2006/0060303 A1 * 3/2006 Fink ..................... H01J 37/3244
156/345.29
(Continued)

FOREIGN PATENT DOCUMENTS

JP 2010-239103 10/2010
JP 2013-168437 8/2013
(Continued)

*Primary Examiner* — Robert M Kunemund
(74) *Attorney, Agent, or Firm* — Nath, Goldberg & Meyer; Jerald L. Meyer

(57) ABSTRACT

An apparatus includes: a rotatable table for revolving a substrate mounting region on which a substrate is mounted; a first gas supply part for supplying a source gas to a first region through an injection portion formed to face the rotatable table; an exhaust part for exhausting a gas through an exhaust port; a second gas supply part for supplying an separation gas for separating inner and outer sides of a second closed path from each other through an separation gas supply port formed to extend along the second closed path surrounding the exhaust port; a third gas supply part including two gas injectors arranged to extend at a certain interval in a direction crossing the revolutional direction with a second region defined outside the second closed path interposed between the gas injectors; and a plasma generation part for plasmarizing a reaction gas.

5 Claims, 12 Drawing Sheets

(51) Int. Cl.
  *H01L 21/02*       (2006.01)
  *H01L 21/687*      (2006.01)
(52) U.S. Cl.
  CPC .. *H01L 21/68764* (2013.01); *H01L 21/68771* (2013.01)

(56) References Cited

U.S. PATENT DOCUMENTS

2010/0134797 A1* 6/2010 Arakawa ............ G01N 15/1429
                                              356/338
2015/0007774 A1* 1/2015 Iwasaki ............. C23C 16/45542
                                              118/723 R
2015/0232993 A1* 8/2015 Iwao ................ C23C 16/45536
                                              118/723 AN
2015/0361553 A1* 12/2015 Murakawa .......... C23C 16/4412
                                              156/345.55

FOREIGN PATENT DOCUMENTS

| JP | 2014-165402 A    | 9/2014 |
| KR | 10-2010-0103416 A | 9/2014 |
| KR | 10-2014-0106409 A | 9/2016 |
| WO | 2014-142023 A1   | 9/2014 |

* cited by examiner

<Example>

Thin ← Film thickness → Thick

<Comparative Example>

Thin ◄——— Film thickness ———► Thick

FILM FORMATION APPARATUS

CROSS-REFERENCE TO RELATED APPLICATION

This application claims the benefit of Japanese Patent Application No. 2015-252081, filed on Dec. 24, 2015, in the Japan Patent Office, the disclosure of which is incorporated herein in its entirety by reference.

TECHNICAL FIELD

The present disclosure relates to a technology for forming a thin film by supplying a source gas and a reaction gas reacting with the source gas to a surface of a substrate.

BACKGROUND

As a method of forming a thin film on a semiconductor wafer (hereinafter referred to as a "wafer") as a substrate, a plasma enhanced atomic (molecular) layer deposition (PE-ALD (MLD)) (hereinafter, ALD and MLD are collectively referred to as "ALD") is known. In such a PE-ALD, a wafer is exposed to a source gas containing a precursor of a thin film such that the source gas containing a constituent element of the thin film is adsorbed onto the wafer. Then, the wafer onto which the source gas is adsorbed is exposed to plasma of a reaction gas. The reaction gas decomposes the aforementioned precursor or supplies other constituent elements capable of being coupled to the constituent element of the precursor, thereby to form a desired atom layer or molecular layer on the wafer. In the PE-ALD, a thin film in which the atom layers or the molecular layers are deposited by repeating the above processes is formed on the wafer.

As an apparatus for performing the PE-ALD, a sheet-wafer type film formation apparatus and a semi-batch type film formation apparatus are known. In the sheet-wafer type film formation apparatus, wafers are loaded into a vacuum container one by one, and a source gas and a reaction gas are alternately supplied into the vacuum container. In the semi-batch type film formation apparatus, an inner space of a vacuum container is partitioned into a region to which a source gas is supplied and a region to which a reaction gas is supplied, and wafers sequentially pass through these regions. The semi-batch type film formation apparatus supplies the source gas and the reaction gas in different regions, thus simultaneously processing a plurality of wafers. Thus, the semi-batch type film formation apparatus is advantageous in that it has higher throughput than the sheet-wafer type film formation apparatus.

For example, the present inventors developed a first semi-batch type film formation apparatus, in which a rotatable table (mounting stand) that is rotatable around an axis thereof is installed inside a vacuum container (this is expressed as a "process container" in the related art and this expression is similarly applied even in the Background section of the present disclosure), and the interior of the vacuum container is partitioned into a first region to which a source gas (precursor gas) is supplied and a second region to which a plasmarized reaction gas is supplied. A plurality of wafers is arranged on the rotatable table in a circumferential direction. With the rotation of the rotatable table, each of the wafers repeatedly passes through the first and second regions in an alternate manner, so that a film formation process is performed on each of the wafers.

In such a first film formation apparatus, the first region is configured as a fan-shaped space defined by partitioning a portion of a circular space above the rotatable table in the circumferential direction, and the second region is defined by the remaining space. The first region is separated from the second region by an exhaust port formed to surround discharge portions (injection portions) from which the source gas is supplied, and a separation gas supply port (injection port) formed to surround the exhaust port and supply a separation gas (purge gas) therethrough.

According to the first film formation apparatus, the second region to which the reaction gas is supplied and requires a longer reaction time than a time required in adsorbing the source gas, is increased in size, thus forming a thin film having good film quality.

On the other hand, a film formation apparatus is required to secure in-plane uniformity of a thin film formed on a wafer. Such a requirement holds true in the conventional first film formation apparatus.

In addition, there is known a second semi-batch type film formation apparatus in which an activation gas injector is installed in a direction crossing a movement direction of wafers that are circumferentially arranged on a rotatable table. However, the second film formation apparatus has a structure in which a portion of a ceiling surface constituting a vacuum container is formed to approach the rotatable table so as to form a restricted space. This structure separates regions (process regions) to which different gases are supplied. Accordingly, the second film formation apparatus is different in type from the first film formation apparatus.

Thus, the second film formation apparatus does not describe the configuration in which in-plane uniformity of a thin film can be improved in a case where a reaction gas is supplied over a wide region as in the second region of the first film formation apparatus.

SUMMARY

Some embodiments of the present disclosure provide a film formation apparatus configured in a semi-batch type and capable of forming a thin film exhibiting good in-plane uniformity.

According to one embodiment of the present disclosure, there is provided a film formation apparatus configured to form a thin film on a substrate within a vacuum container, including: a rotatable table disposed within the vacuum container and configured to revolve a substrate mounting region on which the substrate is mounted about a rotational center of the rotatable table; a first gas supply part configured to supply a source gas of the thin film to a first region through an injection portion formed to face the rotatable table, the first region being defined by partitioning a revolution plane through which the substrate mounting region passes, in a direction crossing a revolutional direction of the substrate mounting region; an exhaust part configured to exhaust a gas through an exhaust port formed to extend along a first closed path surrounding the injection portion; a second gas supply part configured to supply an separation gas for separating inner and outer sides of a second closed path from each other through an separation gas supply port formed to extend along the second closed path surrounding the exhaust port; a third gas supply part including two gas injectors arranged to extend at a certain interval in the direction crossing the revolutional direction of the substrate mounting region with a second region defined outside the second closed path interposed between the two gas injectors, each of the two gas injectors having gas injection holes formed therein, through which a reaction gas reacting with the source gas is supplied toward the second region; and a plasma generation part configured to plasmarize the reaction gas injected toward the second region, wherein an angle defined between the two gas injectors is less than 180 degrees.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, a film formation apparatus according to one embodiment of the present disclosure will be described with reference to FIG. 1 to FIG. 8. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In this embodiment, an example in which a silicon nitride (SiN) film is formed on a substrate by causing a source gas containing dichlorosilane ($SiH_2Cl_2$) as a precursor to react with a reaction gas containing ammonia ($NH_3$) will be described.

Figure 1:
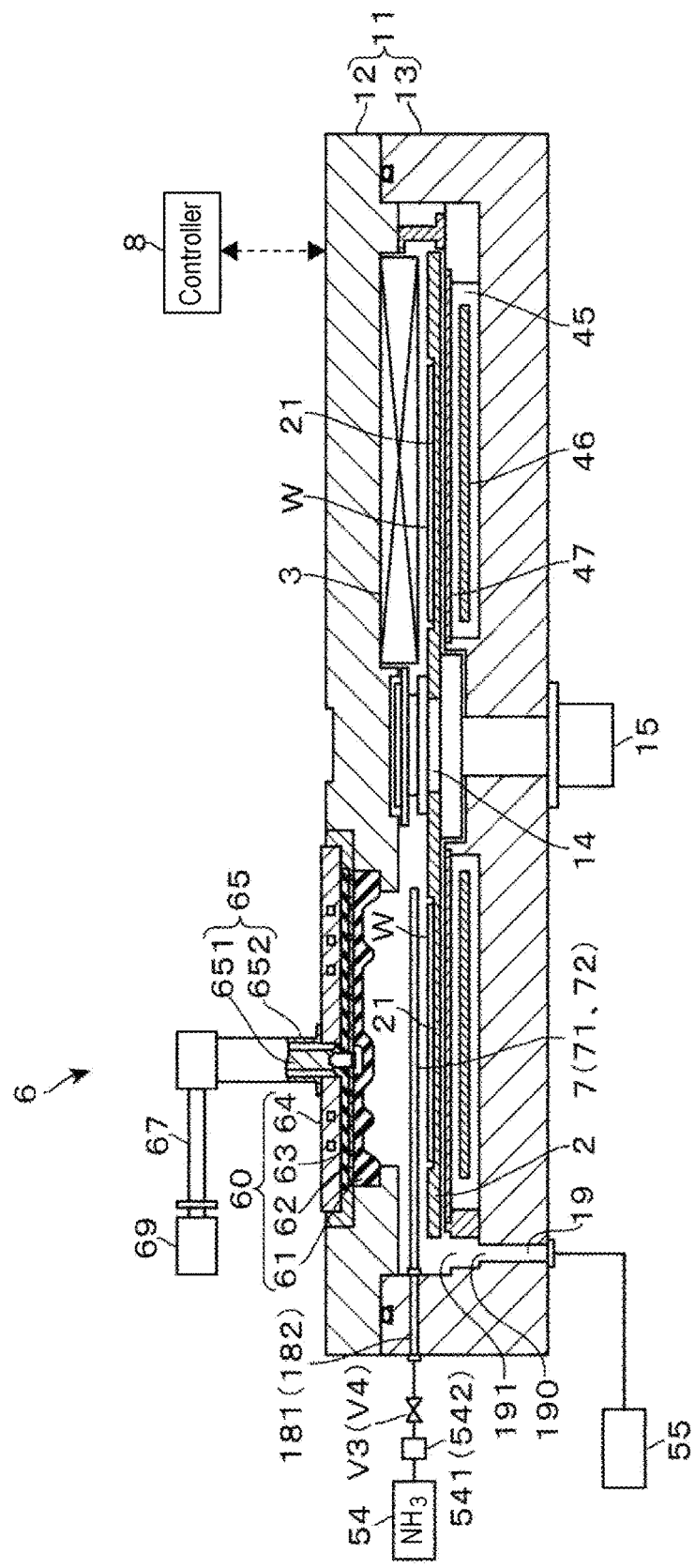
FIG. 1 is a longitudinal cross-sectional view of a film formation apparatus according to one embodiment of the present disclosure.
Figure 2:
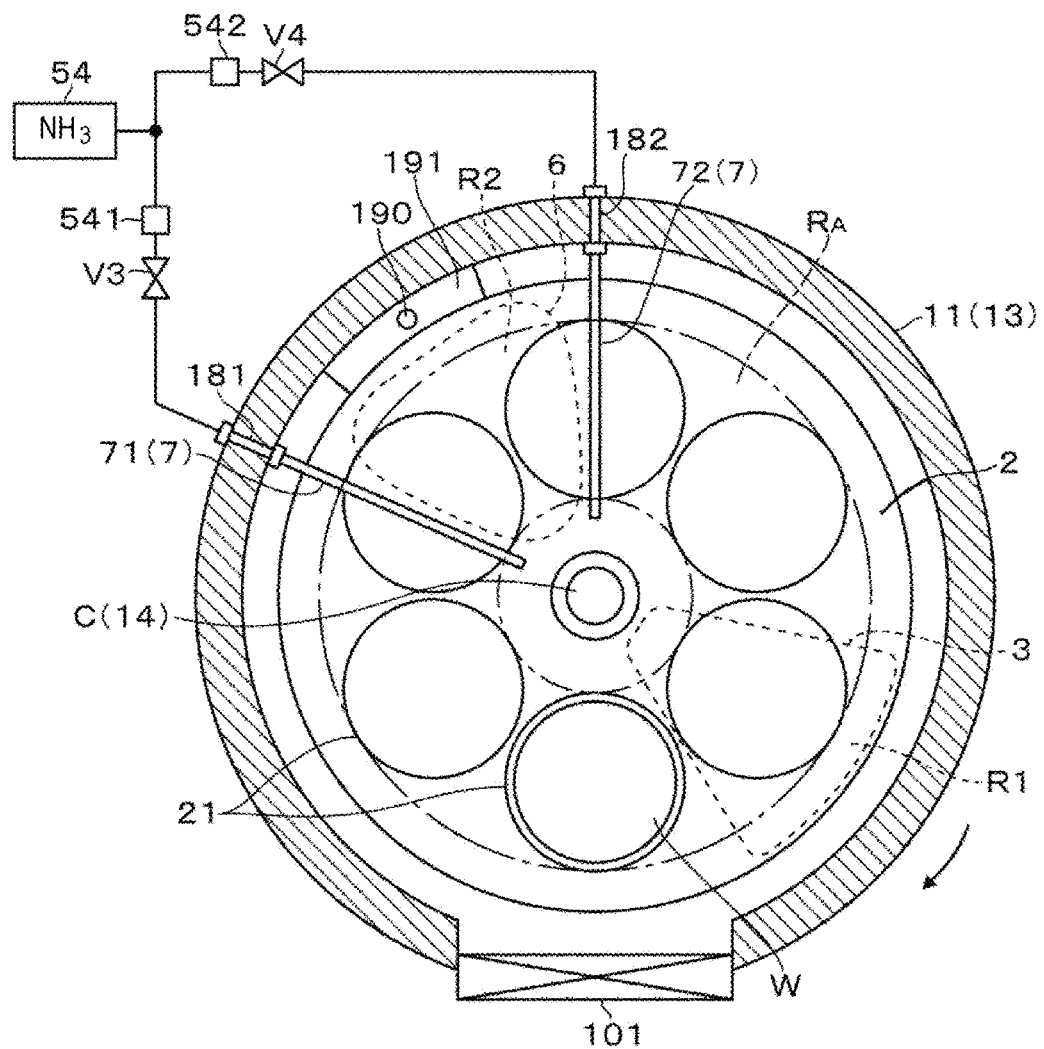
FIG. 2 is a transverse plan view of the film formation apparatus.

Referring to FIG. 1 and FIG. 2, the film formation apparatus includes: a vacuum container 11 defining a process space in which a film formation process is carried out; a rotatable table 2 disposed inside the vacuum container 11 and having a plurality of wafer mounting regions 21 formed therein; a source gas unit 3 configured to supply a source gas toward a first region R1 in a space defined above the rotatable table 2; a gas injector 7 (first and second gas injectors 71 and 72) configured to supply a reaction gas toward a second region R2 partitioned from the first region R1; and a plasma generation part 6 configured to generate plasma of the reaction gas supplied from the gas injector 7.

The vacuum container 11 is composed of a container body 13 constituting a sidewall and a bottom of the vacuum container 11, and a ceiling plate 12 for air-tightly sealing an opening formed at an upper side of the container body 13. The vacuum container 11 has a substantially circular flat shape in a plan view. The vacuum container 11 (the ceiling plate 12 and the container body 13) is formed of, for example, metal such as aluminum, and has an inner surface subjected to a plasma resistance treatment (for example, an alumite treatment or a thermal spray treatment of a ceramic material).

The rotatable table 2 disposed inside the vacuum container 11 is subjected to, for example, the same plasma resistance treatment as that is applied to the vacuum container 11, and is composed of a circular plate formed of a ceramic material. The rotatable table 2 is provided at the center thereof with a rotational shaft 14 vertically extending downward. A rotational driving mechanism 15 such as a motor configured to rotate the rotatable table 2 around the vertical axis, is installed at a lower end of the rotational shaft 14.

The upper surface of the rotatable table 2 has at least one wafer mounting region 21. In this embodiment, as shown in FIG. 1, six wafer mounting regions 21 are arranged around a rotational center of the rotatable table 2 in the circumferential direction. Each of the wafer mounting regions 21 is configured as a circular recess having a slightly greater diameter than a wafer W.

Figure 7:
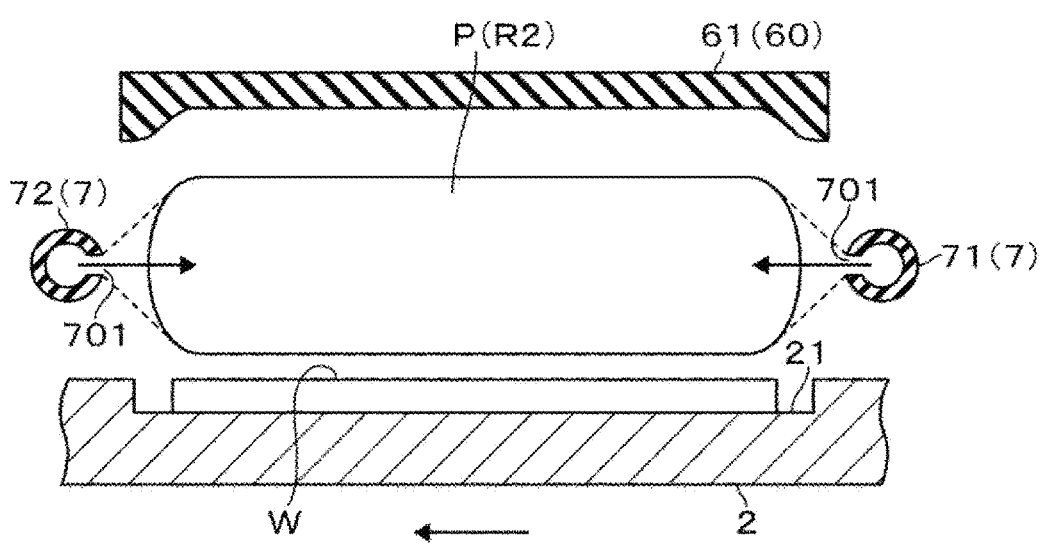
FIG. 7 is a diagram illustrating a state where a gas injector is disposed in the second region of the film formation apparatus.
Figure 8:
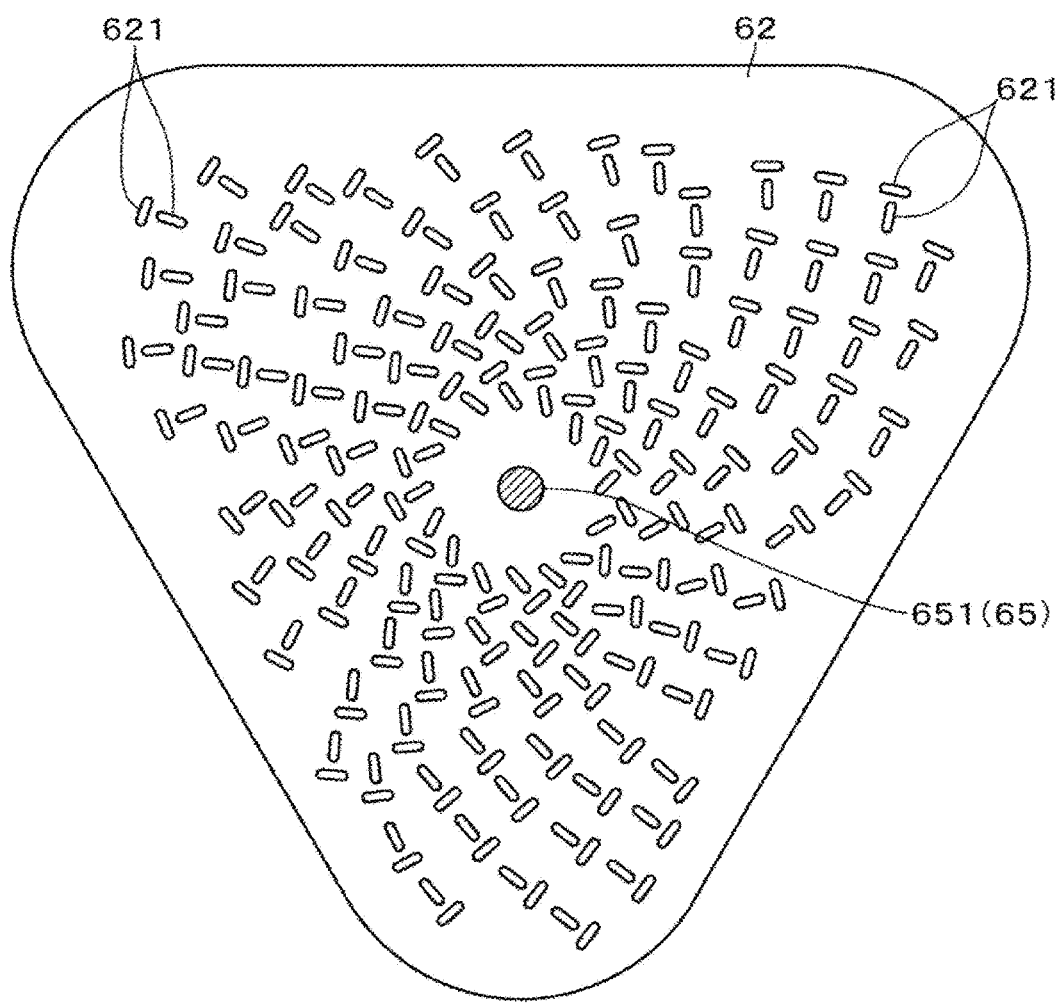
FIG. 8 is a plan view of a slot plate in a plasma generation part disposed in the second region of the film formation apparatus.

In addition, the configuration of the wafer mounting regions 21 is not limited to a simple recess shape which merely receives the wafer W (for example, see FIG. 7). For example, in addition to the recess, the wafer mounting region 21 may have an annular groove formed along the periphery of the wafer W and having a greater depth than the recess so as to adjust a retention time of the source gas or the reaction gas.

Figure 4:
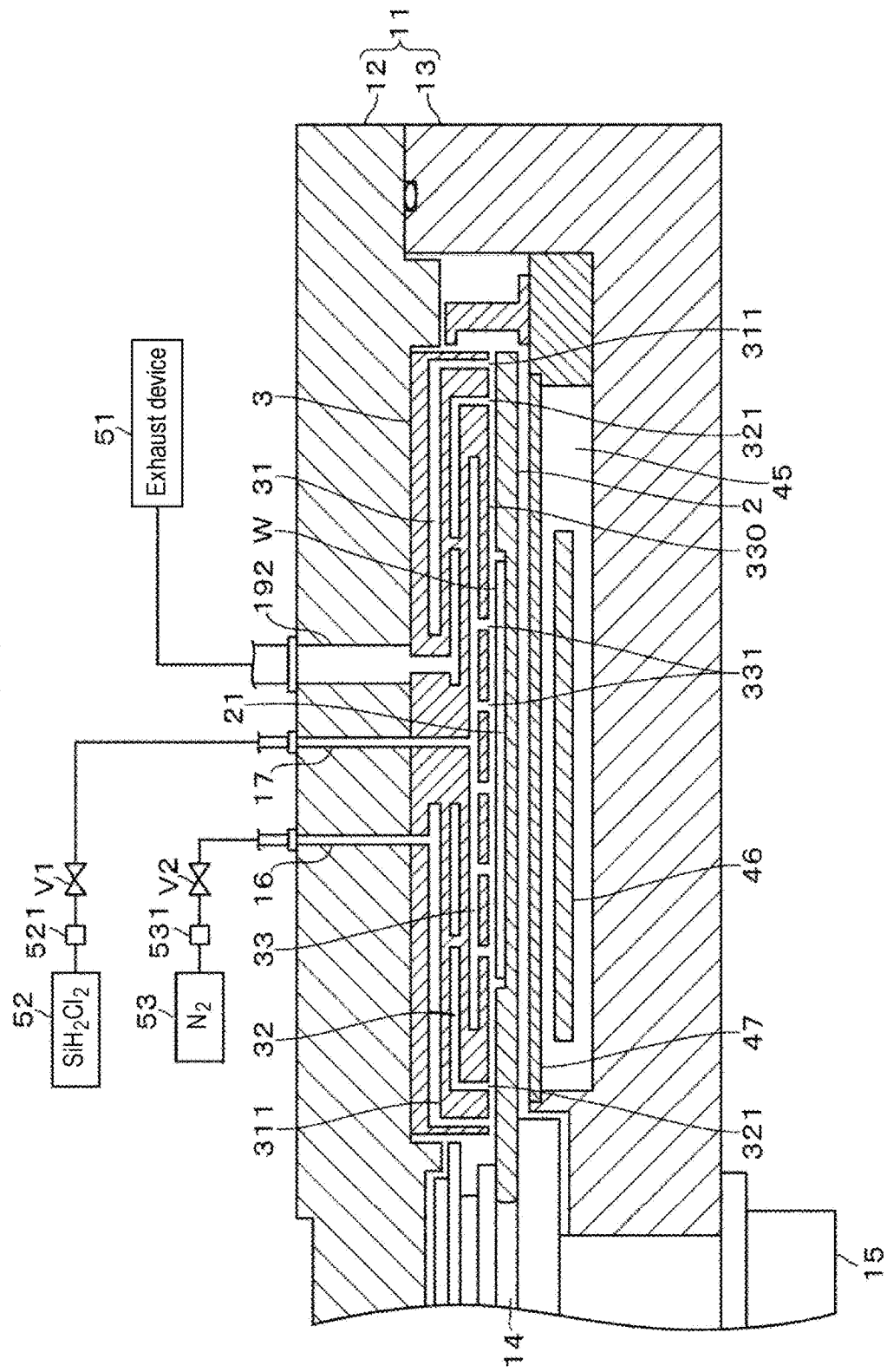
FIG. 4 is an enlarged longitudinal cross-sectional view of a first region of the film formation apparatus.
Figure 6:
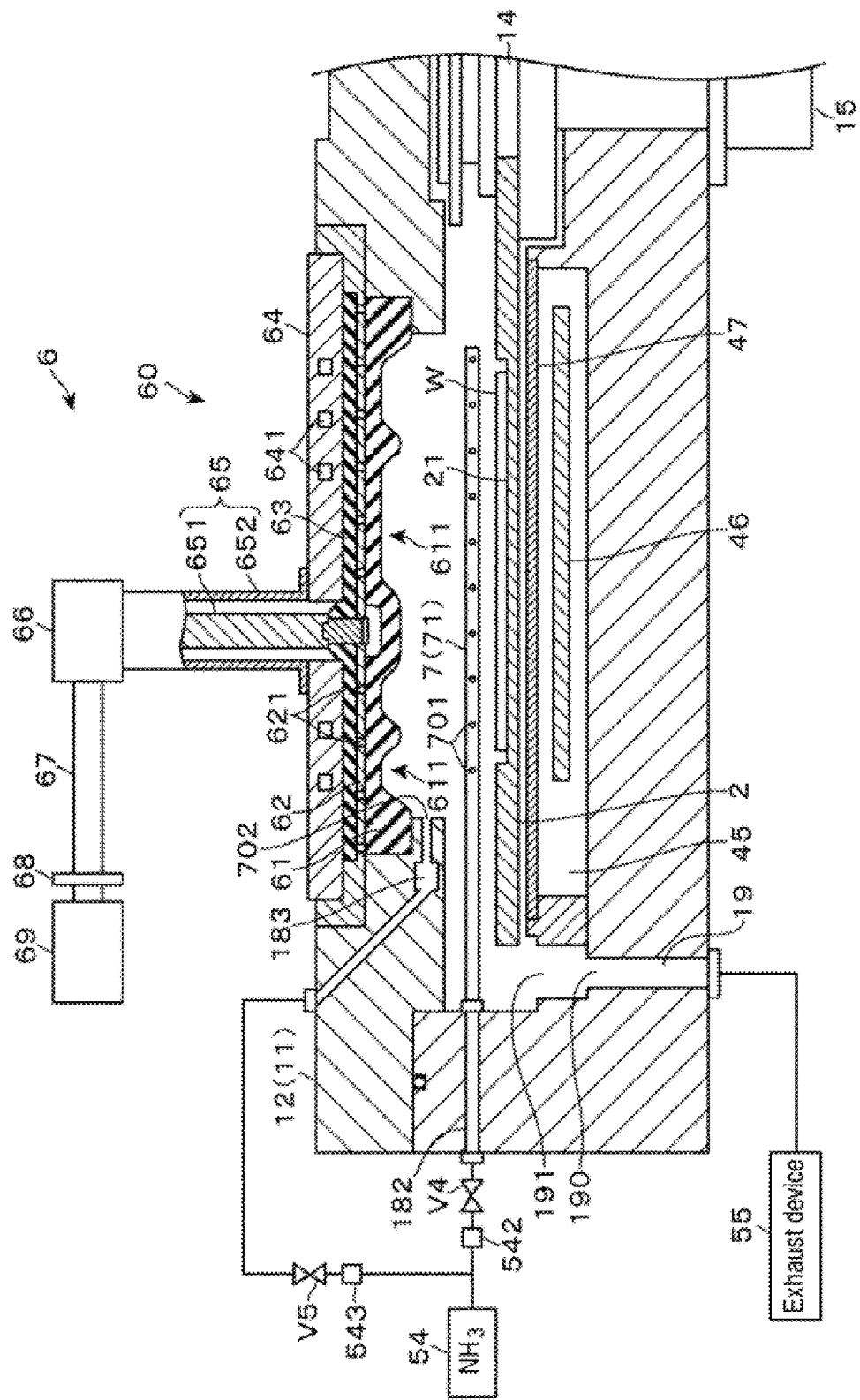
FIG. 6 is an enlarged longitudinal cross-sectional view of a second region of the film formation apparatus.

As shown in FIGS. 1, 4 and 6, an annular groove 45 having a flat annular shape is formed in the bottom of the container body 13 disposed below the rotatable table 2 in the circumferential direction of the rotatable table 2. In the annular groove 45, a heater 46 is disposed corresponding to a region in which the wafer mounting regions 21 are arranged. The heater 46 is to heat the wafers W mounted on the rotatable table 2 up to a temperature suitable for reaction between the source gas and the plasma of the reaction gas. In addition, an opening on an upper surface of the annular groove 45 is closed by a heater cover 47 which is an annular plate member. For example, the heater cover 47 is formed of a material allowing electromagnetic waves radiated from the heater 46 to pass therethrough such that a heat radiation from the heater 46 is travelled toward the rotatable table 2.

Figure 3:
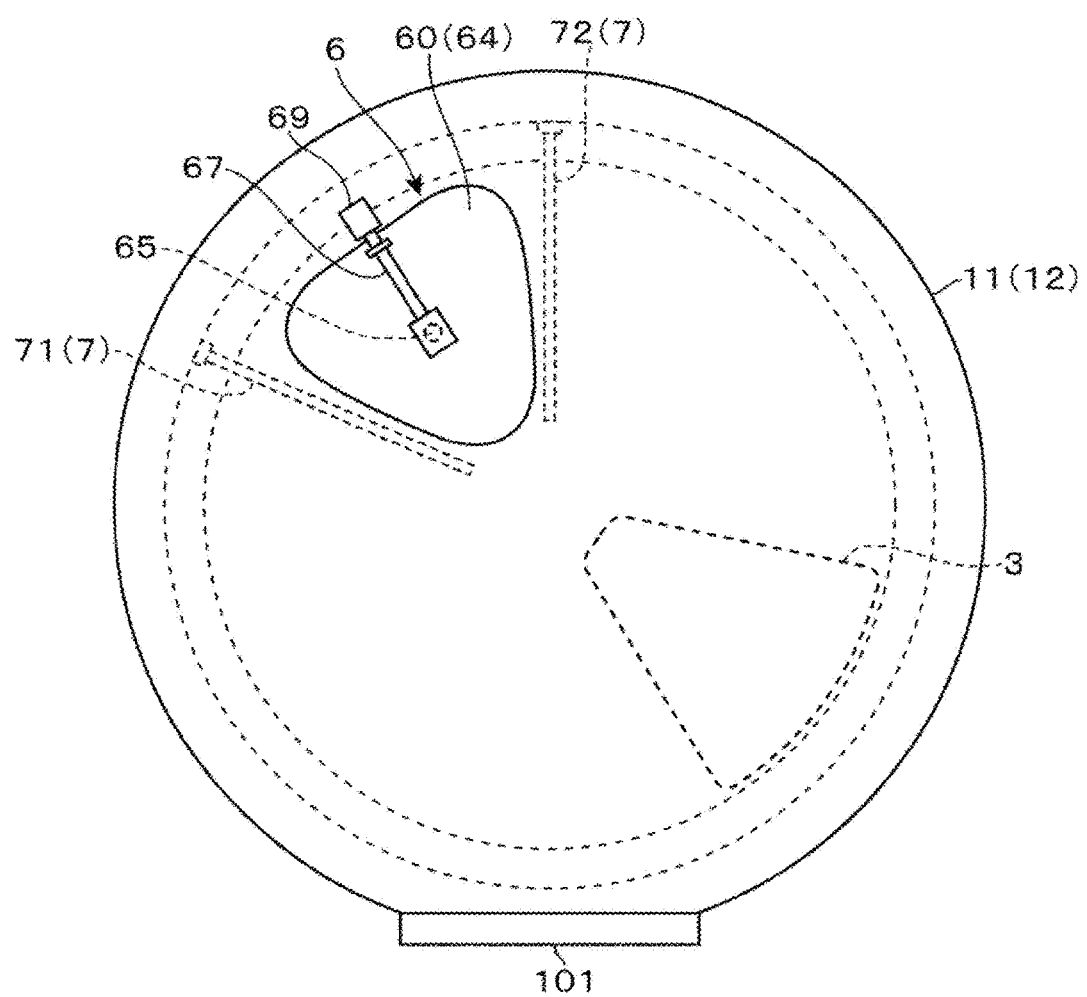
FIG. 3 is a top view of the film formation apparatus.

As shown in FIGS. 2 and 3, and the like, an inlet/outlet port 101 configured to be opened or closed by a gate valve (not shown) is formed in the sidewall of the vacuum container 11 (the container body 13). A wafer W held by a transfer mechanism disposed outside the vacuum container 11 is carried into the vacuum container 11 through the inlet/outlet port 101. Transfer of the wafer W between the transfer mechanism and each of the wafer mounting regions 21 is performed by lift pins (not shown) configured to move up and down between an upper location and a lower location of the rotatable table 2 through respective through-holes (not shown) formed in each of the wafer mounting regions 21.

In the rotatable table 2 configured as above, when the rotatable table 2 is rotated by the rotational shaft 14, the wafer mounting regions 21 revolve about the rotational center C of the rotatable table 2 shown in FIG. 2. Assuming that a region through which the wafer mounting regions 21 pass with the rotation of the rotatable table 2 is referred to as a revolution plane $R_A$, the revolution plane $R_A$ in this embodiment is defined by an annular region surrounded by a dash-dot line in FIG. 2.

As shown in FIG. 1 and FIG. 4, the source gas unit 3 is disposed on a lower surface of the ceiling plate 12 facing the upper surface of the rotatable table 2. In addition, as shown in FIG. 2 and FIG. 3, the source gas unit 3 has a fan shape in a plan view, as defined by partitioning the revolution plane $R_A$ of the wafer mounting regions 21 in a direction crossing the revolutional direction of the wafer mounting regions 21.

As shown in an enlarged longitudinal cross-sectional view of FIG. 4, for example, the source gas unit 3 has a structure in which a plurality of plate members each having a recess or an opening is stacked one above another. As a result, in the inner structure of the source gas unit 3, a source gas diffusion space 33 in which the source gas is diffused, an exhaust space 32 through which the source gas is exhausted, an separation gas diffusion space 31 in which an separation gas for separating a region under the source gas unit 3 and a region outside the source gas unit 3 is diffused, are sequentially stacked from below upward.

The source gas diffusion space 33 formed as the lowermost region of the source gas unit 3 is coupled to a source gas supply source 52 through a series of a source gas supply channel 17, an on-off valve V1 and a flow rate regulating part 521. The source gas supply source 52 supplies a source gas containing dichlorosilane.

Figure 5:
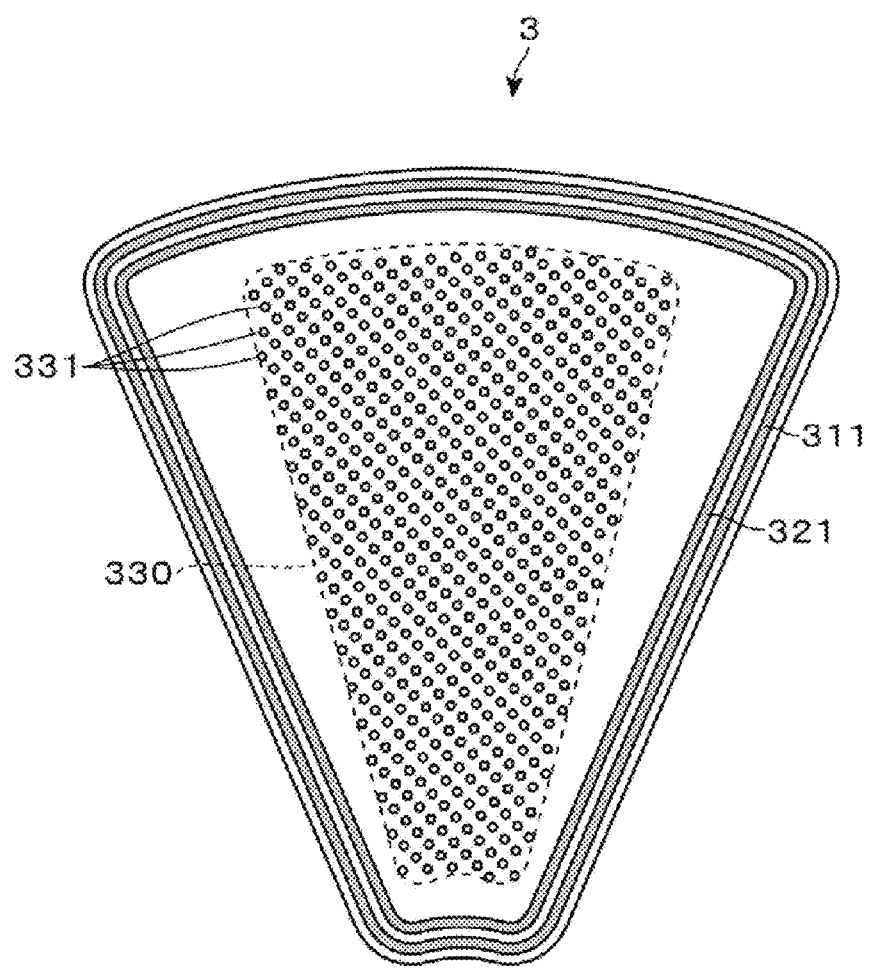
FIG. 5 is a bottom view of a source gas unit disposed in the first region of the film formation apparatus.

As shown in FIG. 4 and FIG. 5 which is a bottom view of the source gas unit 3, the source gas diffusion space 33 (the source gas unit 3) is formed in a lower surface thereof with a plurality of injection holes 331 through which the source gas is supplied from the source gas diffusion space 33 toward the rotatable table 2.

As shown in FIG. 5, the injection holes 331 are dispersedly formed in a fan-shaped region as indicated by a dotted line of FIG. 5. In the fan-shaped region, the length of two sides extending in the radial direction of the rotatable table 2 is greater than the diameter of the wafer mounting regions 21 (the wafer W). As a result, when each of the wafer mounting regions 21 passes a region below the source gas unit 3 disposed above the revolution plane $R_A$ of the respective wafer mounting region 21, the source gas is supplied to the entire surface of the wafer W mounted inside the wafer mounting region 21 through the injection holes 331.

The region with the plurality of injection holes 331 formed therein corresponds to an injection portion 330 of the source gas. In addition, the combination of the injection portion 330, the source gas diffusion space 33, the source gas supply channel 17, the on-off valve V1, the flow rate regulating part 521, and the source gas supply source 52 constitutes a first gas supply part of this embodiment.

As shown in FIG. 4 and FIG. 5, the exhaust space 32 defined above the source gas diffusion space 33 is in communication with an exhaust port 321, which is formed to extend along a closed path (first closed path) surrounding the injection portion 330. In addition, the exhaust space 32 is coupled to an exhaust device 51 through an exhaust path 192 and forms an independent flow passage through which the source gas supplied from the source gas diffusion space 33 to a region under the source gas unit 3 is exhausted to the exhaust device 51.

The combination of the exhaust port 321, the exhaust space 32, the exhaust path 192, and the exhaust device 51 constitutes an exhaust part of this embodiment.

As shown in FIG. 4 and FIG. 5, the separation gas diffusion space 31 defined above the exhaust space 32 is in communication with an separation gas supply port 311, which is formed to extend along a closed path (second closed path) surrounding the exhaust port 321. In addition, the separation gas diffusion space 31 is coupled to a separation gas supply source 53 through a series of a separation gas supply channel 16, an on-off valve V2 and a flow rate regulating part 531. The separation gas supply source 53 supplies a separation gas which separates inner and outer atmospheres of the separation gas supply port 311 from each other while acting as a purge gas for removing the source gas excessively adsorbed on the wafer W. The separation gas may be an inert gas, for example, a nitrogen gas.

The combination of the separation gas supply port 311, the separation gas diffusion space 31, the separation gas supply channel 16, the on-off valve V2, the flow rate regulating part 531, and the separation gas supply source 53 constitutes a second gas supply part of this embodiment.

According to the source gas unit 3 configured as above, the source gas supplied through the injection holes 331 of the injection portion 330 spreads toward the periphery side of the upper surface of the rotatable table 2 while flowing along the upper surface, reaches the exhaust port 321 and is finally exhausted from the upper surface of the rotatable table 2. Accordingly, within the vacuum container 11, a region in which the source gas exists is limited inward of the exhaust port 321 formed along the first closed path (the first region R1).

Further, as described above, the source gas unit 3 has a shape defined by partitioning a portion of the revolution plane $R_A$ of the wafer mounting region 21 in the direction crossing the revolutional direction of the wafer mounting region 21. Accordingly, when the rotatable table 2 is rotated, the wafer W mounted on each of the wafer mounting regions 21 passes through the first region R1 so that the source gas can be adsorbed onto the entire surface of the wafer W.

On the other hand, the separation gas supply port 311 is formed around the exhaust port 321 along the second closed path and the separation gas is supplied from the separation gas supply port 311 toward the upper surface of the rotatable table 2. Accordingly, the inside and the outside of the first region R1 are separated doubly by the exhaust operation performed using the exhaust port 321 and the separation gas supplied through the separation gas supply port 311. This configuration suppresses the source gas from leaking to the outside of the first region R1 and suppresses the reaction gas from incoming from the outside of the first region R1.

Figure 9:
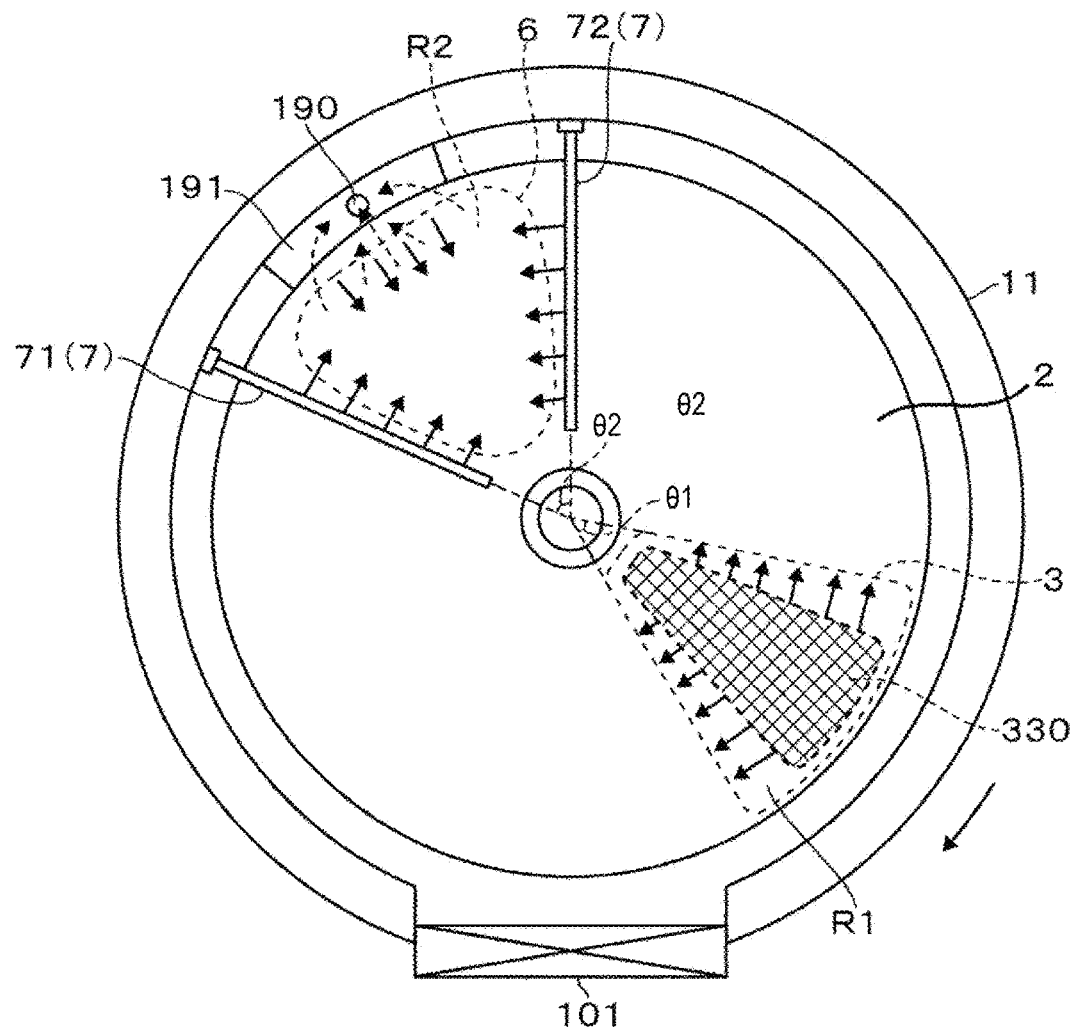
FIG. 9 is a diagram illustrating the operation of the film formation apparatus.

The first region R1 may be set to any range without limitation so long as the first region R1 can secure a sufficient contact time for the source gas to be adsorbed onto the entire surface of the wafer W without interfering with the second region R2 defined outside the first region R1 and to which the reaction gas is supplied. For example, in the case where the first region R1 is formed in a fan shape, an angle Θ1 defined between two sides of the first region R1 extending in the radial direction of the rotatable table 2 is adjusted to be less than 180 degrees at maximum, specifically, to fall within a range of 10 to 110 degrees. Further, for the sake of avoiding complexity of descriptions of FIG. 3, the angle Θ1 is shown in FIG. 9.

Using the source gas unit 3 configured as above, the source gas is supplied to the wafer W mounted on each of the wafer mounting regions 21, and subsequently, the plasmarized reaction gas generated outside the first region R1 is supplied to the wafer W. Thus, the source gas adsorbed onto the wafer W reacts with the reaction gas to form a molecular layer of silicon nitride.

The present inventors found that, in order to form a thin film having high in-plane uniformity in forming a silicon nitride film by depositing the molecular layers, it is important to form a region where a concentration of the plasmarized reaction gas is high. In this regard, it is sometimes the case that a method of supplying the reaction gas to the entire space defined above the rotatable table 2 other than the source gas unit 3 (the first region R1) fails to form the region where the concentration of the reaction gas is high.

Accordingly, in the film formation apparatus according to this embodiment, two gas injectors 7 (the first and second gas injectors 71 and 72) are used to form the region where the concentration of the reaction gas is high. The following description will be given of one example of a mechanism for supplying the plasmarized reaction gas using the gas injectors 7.

As shown in FIGS. 2 and 6, and the like, at a downstream side of a rotation direction of the rotatable table 2 (in the clockwise direction when viewed from the top in this embodiment), the two gas injectors 7 (the first and second gas injectors 71 and 72) which extend in the radial direction of the rotatable table 2 (the direction crossing the revolutional direction of the wafer mounting regions 21) and are formed in an elongated stick-shape, are inserted into the vacuum container 11 in a mutually spaced-apart relationship along the circumferential direction of the rotatable table 2.

Immediately after the wafer W mounted in the wafer mounting region 21 passes through the first region R1, an excessively-adsorbed source gas (dichlorosilane in this embodiment) may still remain even after purging the source gas with the separation gas. Accordingly, in order to secure sufficient time to discharge the excessively-adsorbed source gas by the heating performed by the heater 46 or the like, the supply of the reaction gas may be performed at a place spaced apart from the downstream side of the first region R1.

In the case of forming the silicon nitride film, each of the gas injectors 7 is formed of, for example, an elongated ceramic cylindrical member. The interior of the gas injectors 7 defines a cavity and has a flow passage through which the source gas flows in the longitudinal direction thereof. In addition, as shown in FIG. 6, a plurality of reaction gas injection holes 701 is formed at certain intervals in a lateral side of each of the gas injectors 7 so as to supply the reaction gas over the entire surface of the wafer W mounted in each of the wafer mounting regions 21.

As shown in FIG. 2 and FIG. 6, the gas injectors 7 (the first and second gas injectors 71 and 72) are arranged such that they are substantially horizontally inserted into the sidewall of the vacuum container 11 (the container body 13) toward the rotational center of the rotatable table 2 at an interval of an angle $\Theta 2$. Like the angle $\Theta 1$, the angle $\Theta 2$ is shown in FIG. 9.

The gas injectors 7 are coupled to a reaction gas supply source 54 through on-off valves V3 and V4, and flow rate regulating parts 541 and 542, respectively. The reaction gas supply source 54 supplies an ammonia (NH$_3$)-containing reaction gas. The combination of the gas injectors 7 (the first and second gas injectors 71 and 72), the on-off valves V3 and V4, the flow rate regulating parts 541 and 542, and the reaction gas supply source 54 constitutes a third gas supply part of this embodiment.

As schematically shown in FIG. 7, the first and second gas injectors 71 and 72 are arranged such that the reaction gas injection holes 701 formed in one injector face those formed in another injector. Thus, the reaction gas can be supplied toward a plasma generation region P in which plasma of the reaction gas is generated by an antenna part 60 for generating plasma (to be described below). The range of the plasma generation region P varies depending upon conditions such as an internal pressure of the vacuum container 11, the kind, concentration or flow rate of the source gas, or the like.

Conversely, the arrangement height of the first and second gas injectors 71 and 72, the range in which the reaction gas injection holes 701 are formed along the longitudinal direction of the first and second gas injectors 71 and 72, the orientation of the reaction gas injection holes 701 and the like are set such that the source gas can be injected toward the plasma generation region P, based on a promise that various conditions are determined depending upon a range in which the plasma generation region P is formed. The formation range of the plasma generation region P can be confirmed by a plasma light emission area.

In addition, if the gas injectors 7 are arranged inside the plasma generation region P, the reaction gas starts to be plasmarized inside the gas injectors 7, which may deteriorate activity of the plasma of the reaction gas injected from the reaction gas injection holes 701. Accordingly, as shown in FIG. 7, the gas injectors 7 (the first and second gas injectors 71 and 72) are arranged near the plasma generation region P.

As described above, it is possible to form the region where the concentration of the reaction gas is high by using the two gas injectors 7 (the first and second gas injectors 71 and 72) arranged to inject the reaction gas toward a certain region through the reaction gas injection holes 701, in a state where the certain region defined outside the first region R1 to which the source gas is supplied is interposed between the two gas injectors 7.

In view of forming the region where the concentration of the reaction gas is high, the angle $\Theta 2$ defined between the two gas injectors 7 (the first and second gas injectors 71 and 72) may be adjusted to be less than 180 degrees. Specifically, the angle $\Theta 2$ may be adjusted in a range of 10 to 110 degrees, ultimately in a range of 40 to 80 degrees.

Furthermore, as shown in FIG. 6, in the film formation apparatus according to this embodiment, peripheral-side reaction gas injection holes 702 are formed to supply the reaction gas from a position, which corresponds to a peripheral side of the rotatable table 2, toward the region defined between the two gas injectors 7 (the first and second gas injectors 71 and 72). For example, the peripheral-side reaction gas injection holes 702 are formed in an inner peripheral surface of the ceiling plate 12 having an opening portion formed therein, which supports a dielectric window 61. Thus, the reaction gas is supplied toward a region under the dielectric window 61 formed in the antenna part 60 (to be described later).

The peripheral-side reaction gas injection holes 702 are arranged at certain intervals along one side of the periphery of the rotatable table 2 in the second region R2 defined between the two gas injectors 7 (the first and second gas injectors 71 and 72) and having a triangular shape in a plan view. As a result, as schematically indicated by solid lines in the second region R2 shown in FIG. 10, the reaction gas can be injected from the one side of the periphery of the rotatable table 2 in the direction crossing the revolutional direction of the wafer mounting regions 21 through the peripheral-side reaction gas injection holes 702.

As shown in FIG. 6, each of the peripheral-side reaction gas injection holes 702 is in communication with a reaction gas supply channel 183 formed to extend along one side of the inner peripheral surface of the ceiling plate 12. The reaction gas supply channel 183 is coupled to the reaction gas supply source 54 through an on-off valve V5 and a flow rate regulating part 543 disposed outside the ceiling plate 12. By forming the peripheral-side reaction gas injection holes 702, it is possible to supply the reaction gas toward the region to which the reaction gas is supplied from the two gas injectors 7 described above, thereby further increasing the concentration of the reaction gas in the respective region. The combination of the reaction gas supply channel 183, the peripheral-side reaction gas injection holes 702, the on-off valve V5, the flow rate regulating part 543, and the reaction gas supply source 54 constitutes a fourth gas supply part of this embodiment. In FIG. 1, the peripheral-side reaction gas injection holes 702, the reaction gas supply channel 183 and the like are omitted for the sake of simplicity.

Further, the supply of the reaction gas from the fourth gas supply part is not essential. For example, the fourth gas supply part may be omitted as long as a high concentration of the reaction gas can be sufficiently supplied from the gas injectors 7 (the first and second gas injectors 71 and 72) toward the region around the periphery of the rotatable table 2.

Next, the plasma generation part 6 configured to plasmarize the reaction gas supplied from the aforementioned gas injectors 7 will be described.

As shown in FIG. 3 and FIG. 6, the plasma generation part 6 includes the antenna part 60 configured to radiate microwaves toward the interior of the vacuum container 11, a coaxial waveguide 65 configured to supply microwaves toward the antenna part 60, and a microwave generator 69. The antenna part 60 is installed in the ceiling plate 12 disposed above the region to which the reaction gas is supplied from the gas injectors 7 (the first and second gas injectors 71 and 72). The antenna part 60 closes a substantially triangular opening portion formed in the ceiling plate 12, which corresponds to the region.

The antenna part 60 is configured as a radial line slot antenna (RLSA®, Tokyo Electron Kabushiki Kaisha)) including the dielectric window 61, a slot plate 62, a dielectric plate 63, and a cooling jacket 64.

The dielectric window 61 is to reduce wavelength of microwaves and is formed of, for example, alumina ceramic. The dielectric window 61 has a substantially triangular shape capable of closing the opening portion of the ceiling plate 12 when viewed from the top. The periphery of the dielectric window 61 is supported by a member around the opening portion formed in the ceiling plate 12. A region inward of the periphery of the dielectric window 61 is exposed toward the interior of the vacuum container 11. In some embodiments, an annular recess 611 having a tapered surface may be formed in lower surface of the dielectric window 61 so as to stably generate plasma by concentrating energy of the microwaves on a certain region.

The slot plate 62 is configured as a substantially triangular metal plate with a plurality of slot holes 621 formed therein. As shown as one example in the plan view of FIG. 8, the plurality of slot holes 621 formed in the slot plate 62 is arranged at certain intervals in a diametric direction oriented from the center of the triangular shape to the periphery thereof and along a circumferential direction. Further, each of the slot holes 621 is formed such that adjacent slot holes 621 and 621 are oriented in a direction crossing with each other or in a direction orthogonal to each other.

Further, the dielectric plate 63 is disposed on the slot plate 62. The dielectric plate 63 is formed of, for example, alumina ceramic, and has a substantially triangular shape corresponding to the shape of the dielectric window 61 or the slot plate 62 in a plan view. The cooling jacket 64 is disposed on the dielectric plate 63. The cooling jacket 64 includes a coolant channel 641 formed therein. The antenna part 60 can be cooled down by causing a coolant to flow through the coolant channel 641.

The antenna part 60 is coupled to the microwave generator 69 through the coaxial waveguide 65, a mode convertor 66, and a waveguide 67. The coaxial waveguide 65 includes a substantially cylindrical inner conductor 651 and a substantially cylindrical outer conductor 652. A lower end portion of the inner conductor 651 is connected to the dielectric plate 63 and an upper end thereof is connected to the mode convertor 66. A lower end portion of the outer conductor 652 is connected to an upper surface of the cooling jacket 64 which is formed of, for example, a metal (conductive) material. An upper end portion of the outer conductor 652 is connected to the mode convertor 66. The inner conductor 651 is received in the outer conductor 652.

The microwave generator 69 generates microwaves having a frequency of, for example, 2.45 GHz. The microwaves generated by the microwave generator 69 is introduced into the coaxial waveguide 65 through a tuner 68 used as a matching device, the waveguide 67, and the mode convertor 66 which converts the microwaves into a propagation mode adapted to flow through the coaxial waveguide 65.

In the plasma generation part 6 configured as above, the microwaves generated by the microwave generator 69 are supplied to the dielectric plate 63 through the coaxial waveguide 65, and then supplied to a space under the dielectric window 61 through the slot holes 621 of the slot plate 62.

As described above, in the plasma generation part 6, the planar shape of the antenna part 60 is the substantially triangular shape corresponding to the fan shape of the region to which the reaction gas is supplied from the two gas injectors 7 (the first and second gas injectors 71 and 72). Accordingly, the region in which the reaction gas is plasmarized has a shape corresponding to the shape of the antenna part 60 (the planar shape of the dielectric window 61 exposed to the interior of the vacuum container 11).

In the film formation apparatus according to this embodiment, the aforementioned region in which the reaction gas is plasmarized is set as the second region R2.

Accordingly, the gas injectors 7 (the first and second gas injectors 71 and 72) may be said to be arranged with the second region R2 interposed between the gas injectors 7. Furthermore, the plasma generation part 6 may be said to have a configuration in which the reaction gas injected toward the second region R2 is plasmarized. In addition, as described above, the gas injectors 7 are arranged to extend in the direction crossing the revolutional direction of the wafer mounting regions 21. The reaction gas injection holes 701 are formed over the range in which the reaction gas can be supplied toward the entire surface of the wafer W. Accordingly, with the rotation of the rotatable table 2, the wafer W mounted in each of the wafer mounting regions 21 passes through the second region R2 where the plasmarized reaction gas can be supplied to the entire surface of the wafer W onto which the source gas is adsorbed.

As shown in FIG. 2 and FIG. 6, an exhaust groove 191 is formed outward of the region in which the second region R2 is formed to exhaust the reaction gas. The exhaust groove 191 is formed in a bottom surface side between the rotatable table 2 and an inner wall surface of the vacuum container 11 in the container body 13 along the circumferential direction of the rotatable table 2. An exhaust port 190 is formed in a bottom portion of the exhaust groove 191. The exhaust port 190 is coupled to an exhaust device 55 configured to evacuate the interior of the vacuum container 11 through an exhaust channel 19.

The combination of the exhaust groove 191, the exhaust port 190, the exhaust channel 19 and the exhaust device 55 constitutes a reaction gas exhaust part of this embodiment. In some embodiments, for example, a rectifying plate having a plurality of orifices formed therein may be installed above the exhaust groove 191 such that the exhaust is uniformly performed outward of the second region R2.

As shown in FIG. 1, the film formation apparatus is provided with a control part 8. The control part 8 is composed of a computer including a central processing unit (CPU) (not shown) and a memory (not shown). The memory stores a program including steps (commands) for outputting control signals to execute respective operations of the rotatable table 2, the first to fourth gas supply parts, and the plasma generation part 6. The program may be stored in a storage medium, for example, a hard disk, a compact disk, a magnetic-optical disk, a memory card, and the like, and may be installed in the memory from the storage medium.

Next, the operation of the film formation apparatus according to this embodiment which is configured as above, will be described.

First, the gate valve of the inlet/outlet port 101 is opened and the wafer W is carried into the vacuum container 11 by an external transfer mechanism. Thereafter, the wafer W is delivered to the respective wafer mounting region 21 of the rotatable table 2 using lift pins (not shown). Such a delivery of the wafer W is performed while intermittently rotating the rotatable table 2 so that all the wafers W are mounted on the respective wafer mounting regions 21.

Then, the transfer mechanism is retracted from the vacuum container 11 and the gate valve of the inlet/outlet port 101 is closed. At this time, the interior of the vacuum container 11 is evacuated to a predetermined pressure by the exhaust devices 51 and 55. Further, a separation gas is supplied from the separation gas supply port 311.

Thereafter, while rotating the rotatable table 2 clockwise at a preset rotational speed, each of the wafers W is heated by the heater 46. Upon confirming that the temperature of the wafers W reaches a preset temperature using a temperature sensor (not shown), the supply of the source gas from the injection portion 330 is initiated and simultaneously, the supply of the reaction gas from the gas injectors 7 (the first and second gas injectors 71 and 72) and the peripheral-side reaction gas injection holes 702 is initiated. Further, in parallel with the initiation of the supply of the reaction gas, microwaves are supplied from the antenna part 60 of the plasma generation part 6.

As a result, as shown in FIG. 9, in the vacuum container 11, the source gas supplied from the injection portion 330 of the source gas unit 3 flows through the interior of the first region R1 which is a restricted space including the exhaust space 32 that surrounds the injection portion 330. Further, the reaction gas, which is supplied from the gas injectors 7 (the first and second gas injectors 71 and 72) and the peripheral-side reaction gas injection holes 702, followed by being plasmarized by the microwaves, followed by being discharged to the exhaust port 190 of the exhaust groove 191, forms a flow having a high concentration of the plasmarized reaction gas inside the second region R2. In addition, the wafer mounting regions 21 of the rotatable table 2 and the wafers W are omitted in FIG. 9 and FIG. 10 (to be described later).

When the source gas is supplied to the first region R1 and the plasmarized reaction gas is supplied to the second region R2, the wafer W mounted on each of the wafer mounting regions 21 alternately passes through the first region R1 and the second region R2. As a result, dichlorosilane of the source gas is adsorbed onto the surface of the wafer W and subsequently, reacts with ammonia in the plasmarized reaction gas, thus forming a molecular layer of silicon nitride on the surface of the wafer W. In this way, the molecular layers of silicon nitride are sequentially laminated to form a thin film of silicon nitride.

In the operation described above, by supplying the reaction gas to the second region R2, it is possible to supply the plasmarized reaction gas to the wafer W with high concentration, as compared with the case where the reaction gas is supplied to the entirety of the interior of the vacuum container 11 excluding the first region R1. As a result, as described in the following examples, it is possible to improve in-plane uniformity in thickness of the film formed on the wafer W.

In some embodiments, the flow rate of the reaction gas supplied from the first gas injector 71 disposed at the upstream side in the rotational direction of the rotatable table 2 may be the same as or different than the flow rate of the reaction gas supplied from the second gas injector 72 disposed at the downstream side in the rotational direction of the rotatable table 2.

For example, after a film is formed on the wafer W, a film thickness distribution of the film formed on the wafer W was measured. This measurement shows that, when viewed in the rotational direction of the rotatable table 2, the film formed on an end portion (upstream end portion) of the wafer W initially entering the second region R2 has a relatively thin thickness, and the film formed on the other end portion (downstream end portion) of the wafer W subsequently entering the second region R2 has a relatively thick thickness. In this case, it can be seen that the flow rate of the reaction gas is regulated such that, for example, the flow rate of the reaction gas supplied from the first gas injector 71 disposed at the upstream side becomes higher than the flow rate of the reaction gas supplied from the second gas injector 72 disposed at the downstream side, thus planarizing the aforementioned film thickness distribution.

If the thin film of silicon nitride having a desired thickness is formed by performing the above operation for a predetermined period of time, the supply of the source gas and the reaction gas and the heating of the wafer W by the heater 46 are stopped. Further, if the temperature of the wafer W is decreased up to a preset temperature, the wafers W are sequentially unloaded from the vacuum container 11 through the inlet/outlet port 101 in a reverse order of the loading operation as described above, and the film formation operation is terminated.

The film formation apparatus according to this embodiment provides the following effects. The two gas injectors 7 (the first and second gas injectors 71 and 72) formed in the rotatable table 2, which extend in the direction crossing the revolutional direction of the wafer mounting regions 21, are arranged such that the second region R2 partitioned from the first region R1 to which the source gas is supplied is interposed between the two gas injectors 7. Further, the reaction gas is injected from the two gas injectors 7 toward the second region R2, followed by being plasmarized, followed by causing the reaction gas thus plasmarized to react with the source gas adsorbed onto the wafer W. In this way, a thin film is formed on the wafer W. At this time, the angle defined between the two gas injectors 7 (the first and second gas injectors 71 and 72) is set to less than 180 degrees. Accordingly, it is possible to form a region in which the concentration of the plasmarized reaction gas is high and a concentration distribution is uniform, as compared with the case where the entire space defined above the rotational table 2 excluding the first region R1 is defined as the second region R2, thus forming a thin film having high in-plane uniformity on the wafer W.

Figure 10:
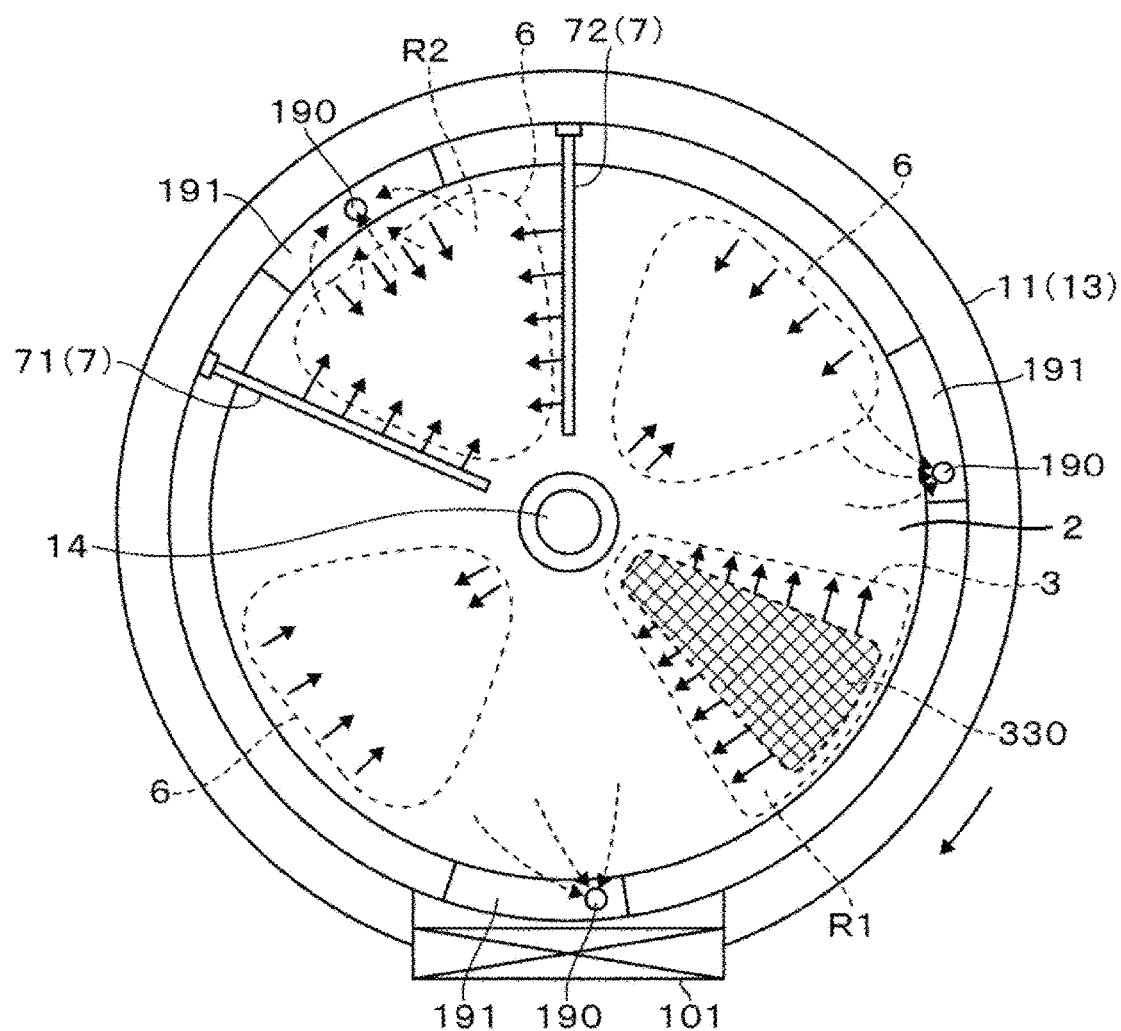
FIG. 10 is a diagram illustrating a modified example of the film formation apparatus.

Here, the reaction gas has been described to be supplied to only the second region R2 using the gas injectors 7 (the first and second gas injectors 71 and 72) but not limited thereto. For example, as shown in FIG. 10, the reaction gas may be supplied from a region other than the second region R2 partitioned from the first region R1, namely, an inner wall side of the chamber body 13 and the rotational shaft 14 side. In FIG. 10, the same components as those of the film formation apparatus described with reference to FIGS. 1 to 9 are denoted by the same reference numerals.

In the film formation apparatus according to this embodiment, a high concentration of the plasmarized reaction gas is supplied to the second region R2 through the gas injectors 7 such that in-plane thickness uniformity of the thin film formed on the wafer W is improved. Accordingly, even if the reaction gas is supplied to other regions at low concentration as compared with the second region R2, it is possible to improve the in-plane thickness uniformity as compared with the case where the second region R2 is not formed. Furthermore, in the case where the reaction gas is supplied to regions other than the second region R2, the plasma generation part 6 may be installed above the other regions as indicated by dotted lines in FIG. 10, or may be omitted in the other regions.

Further, it is not essential that the two gas injectors 7 (the first and second gas injectors 71 and 72) are radially arranged toward the rotational center of the rotatable table 2, as shown in FIG. 2 and the like. For example, the two gas injectors 7 (the first and second gas injectors 71 and 72) may be arranged in a mutually parallel relationship when viewed from the top, with the two gas injectors 7 positioned in the direction crossing the revolutional direction of the wafer mounting regions 21. In this case, when viewed from the top, the first and second gas injectors 71 and 72 which are arranged (in a concentric relationship) at locations separated from the rotational center of the rotatable table 2 by the same distance in the radial direction, an angle between the two gas injectors 7 (the first and second gas injectors 71 and 72) may be less than 180 degrees. This concept can be applied to the case where the first and second gas injectors 71 and 72 have a curved shape instead of a linear stick shape.

Further, even in the case where the first region R1 does not have a fan shape, an angle defined between two sides extending in the direction crossing the revolutional direction of the wafer mounting regions 21 may be defined as in the definition of the angle between the gas injectors 7.

Furthermore, the number of the gas injectors 7 used in forming the second region R2 is not limited to the example in which a single first gas injector 71 is disposed at the upstream side and a single second gas injector 72 is disposed at the downstream side. For example, two or more of the first and second gas injectors 71 and 72 may be vertically arranged one above another, respectively. Even in this case, a plural set of the first and second gas injectors 71 and 72 may be arranged with the second region R2 interposed between the respective first and second gas injectors 71 and 72, and an angle defined between two first and second gas injectors 71 and 72 in each set may be set to be less than 180 degrees.

Furthermore, the configuration of the injection portion 330 for supplying the source gas to the first region R1 is not limited to an example of a porous plate having the plurality of injection holes 331 formed therein as shown in FIG. 5. For example, a reversed bowl-shaped recess whose height is gradually increased from the periphery toward the center may be formed inside the exhaust port 321, and a source gas may be injected from a single gas nozzle installed at an upper end position of the recess.

Methods other than RLSA may be employed instead of the method of plasmarizing the reaction gas. For example, a coil-shaped antenna may be disposed at the upper surface side of the ceiling plate 12 and plasma may be generated by an inductive coupling.

In addition, the kind of thin film formed by the film formation apparatus according to this embodiment is not limited to the silicon nitride. For example, a thin film of silicon oxide ($SiO_2$) may be formed by supplying a BTBAS (bistertiarybutylaminosilane) gas as the source gas and an oxygen ($O_2$) gas as the reaction gas to be plasmarized. In this case, quartz may be used as a material of the gas injectors 7.

Example (Experiment)

Experiment was performed to measure a film thickness distribution of a silicon nitride film formed on a wafer W using the film formation apparatus according to the present embodiment and a conventional film formation apparatus which supplies a reaction gas without having to use the gas injectors 7.

A. Experimental conditions

Example

The silicon nitride film was formed using the film formation apparatus described with reference to FIG. 1 to FIG. 9. A flow rate of the source gas (in a concentration of 100 vol % for dichlorosilane) supplied to the first region R1 was set to 1,000 ccm. A flow rate of the reaction gas (in a concentration of 100 vol % for ammonia) was set to 800 ccm. A heating temperature of the wafer W was set to 475 degrees C. Further, a rotational speed of the rotatable table 2 was set to 20 rpm. A film formation process was performed while the rotatable table 2 rotates a total of 87 times. In the first region R1 having a fan shape, the angle $\Theta 1$ defined between two sides extending in the radial direction of the rotatable table 2 was set to 50 degrees and the angle $\Theta 2$ defined between two gas injectors 7 (the first and second gas injectors 71 and 72) was set to 70 degrees. The film thickness distribution of the silicon nitride film thus formed was measured using a film thickness meter.

Comparative Example

In the film formation apparatus described with reference to FIG. 10, the reaction gas was supplied from the peripheral side of the rotational table 2 and the rotational shaft 14 side to the entire region other than the first region R1 without having to use the gas injectors 7 (the first and second gas injectors 71 and 72). The source gas (in a concentration of 100 vol % for dichlorosilane) was supplied at a flow rate of 1,000 ccm and a flow rate of the reaction gas (in a concentration of 100 vol % for ammonia) was set to 800 ccm. The heating temperature of the wafer W was set to 475 degrees C. The rotational speed of the rotatable table 2 was set to 10 rpm. At this time, a film formation process was performed while the rotatable table 2 rotates a total of 81 times. The film thickness distribution of the silicon nitride film thus formed was measured using a film thickness meter.

B. Experimental Result

Figure 11:
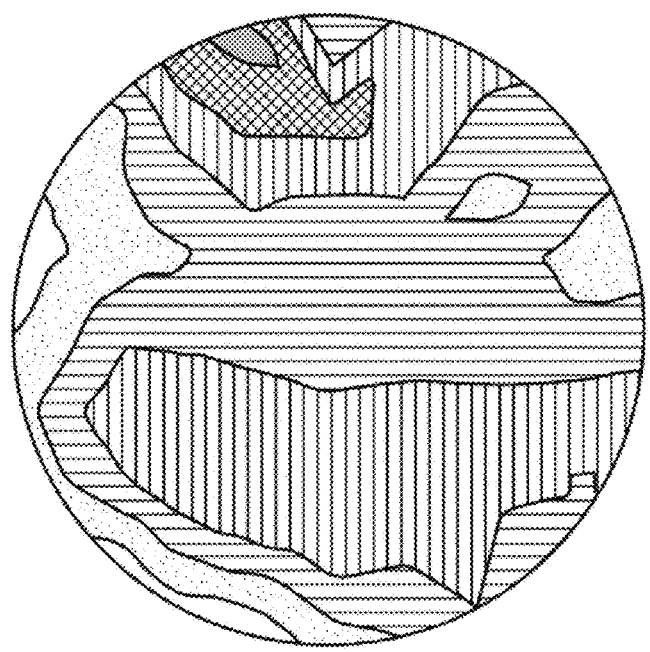
FIG. 11 is a diagram illustrating a film thickness distribution in Example.
Figure 11:
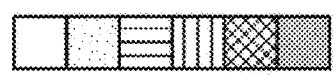
Figure 12:
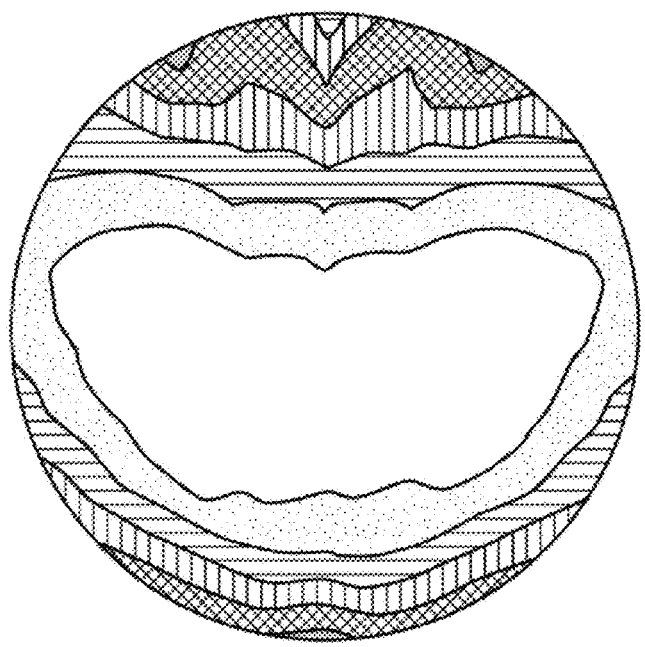
FIG. 12 is a diagram illustrating a film thickness distribution in Comparative Example.
Figure 12:
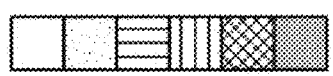

Measurement results of the film thickness distribution of Example are shown in FIG. 11 and measurement results of the film thickness distribution of the Comparative Example are shown in FIG. 12. According to the measurement results of the Example and Comparative Example, the silicon nitride film of the Example was relatively uniform in in-plane film thickness of the wafer W, whereas the silicon nitride films of the Comparative Example exhibited a significant tendency to gradually increase in the film thickness from the peripheral side of the wafer W toward the central side thereof. In terms of a ratio of ±3σ (Å) to an average film thickness (Å), the silicon nitride film of the Example was 1.6%, the silicon nitride film of the Comparative Example was 6.5%.

Accordingly, it could be confirmed that the film formation apparatus according to this embodiment has an effect of improving in-plane uniformity of the thin film formed on the wafer W.

According to the present disclosure in some embodiments, two gas injectors that extend in a direction crossing a revolutional direction of substrate mounting regions formed in a rotatable table are arranged with a second region partitioned from a first region to which a source gas is supplied interposed between the two gas injectors. A reaction gas is injected from both the two gas injectors toward the second region, followed by being plasmarize, and followed by reacting the source gas adsorbed on a substrate to form a thin film. At this time, an angle defined between the two gas injectors is set to less than 180 degrees. Accordingly, it is possible to form a region in which the concentration of the plasmarized reaction gas is high and a concentration distribution is uniform, as compared with the case where the entire space defined above the rotational table excluding the first region is defined as the second region, thus forming a thin film having high in-plane uniformity on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film formation apparatus configured to form a thin film on a substrate within a vacuum container, comprising:
    a rotatable table disposed within the vacuum container and configured to revolve a substrate mounting region on which the substrate is mounted about a rotational center of the rotatable table;
    a first gas supply part configured to supply a source gas of the thin film to a first region through an injection portion formed to face the rotatable table, the first region being defined by partitioning a revolution plane through which the substrate mounting region passes, in a direction crossing a revolutional direction of the substrate mounting region;
    an exhaust part configured to exhaust a gas through an exhaust port formed to extend along a first closed path surrounding the injection portion;
    a second gas supply part configured to supply an separation gas for separating inner and outer sides of a second closed path from each other through an separation gas supply port formed to extend along the second closed path surrounding the exhaust port,
    a third gas supply part including a first gas injector and a second gas injector arranged to extend at a certain interval in the direction crossing the revolutional direction of the substrate mounting region with a second region defined outside the second closed path interposed between the first gas injector and the second gas injector, each of the first gas injector and the second gas injector having gas injection holes formed therein, through which a reaction gas reacting with the source gas is supplied toward the second region; and
    a plasma generation part configured to plasmarize the reaction gas injected toward the second region,
    wherein an angle defined between the first gas injector and the second gas injector is less than 180 degrees, and
    wherein the first gas injector and the second gas injector are arranged such that the gas injection holes formed in the first gas injector face the gas injection holes formed in the second gas injector.

2. The film formation apparatus of claim 1, further comprising: a fourth gas supply part installed inside the vacuum container and including a gas injection hole through which the reaction gas is injected from a peripheral side of the rotatable table toward the second region.

3. The film formation apparatus of claim 1, further comprising: a reaction gas exhaust part installed beyond the second region and outside the rotatable table and configured to exhaust the reaction gas through an exhaust port opened between the vacuum container and the rotatable table.

4. The film formation apparatus of claim 1, wherein the plasma generation part includes a slot plate having a plurality of slots formed therein, through which microwaves are radiated into a region corresponding to a planar shape of the second region, and a dielectric plate installed between the rotatable table and the slot plate and configured to transmit the microwaves radiated from the slot plate therethrough.

5. The film formation apparatus of claim 1, wherein the first region has two sides extending in the direction crossing the revolutional direction of the substrate mounting region, and
    wherein an angle defined between the two sides is less than 180 degrees.

* * * * *